United States Patent
Strock et al.

(10) Patent No.: US 10,670,045 B2
(45) Date of Patent: *Jun. 2, 2020

(54) ABRASIVE BLADE TIPS WITH ADDITIVE LAYER RESISTANT TO CLOGGING

(71) Applicant: UNITED TECHNOLOGIES CORPORATION, Farmington, CT (US)

(72) Inventors: Christopher W Strock, Kennebunk, ME (US); James O Hansen, Glastonbury, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 392 days.

This patent is subject to a terminal disclaimer.

(21) Appl. No.: 15/142,247

(22) Filed: Apr. 29, 2016

(65) Prior Publication Data

US 2017/0314570 A1    Nov. 2, 2017

(51) Int. Cl.
| | |
|---|---|
| *F04D 29/38* | (2006.01) |
| *F01D 11/12* | (2006.01) |
| *C23C 16/00* | (2006.01) |
| *F02C 3/04* | (2006.01) |
| *F02K 3/06* | (2006.01) |

(Continued)

(52) U.S. Cl.
CPC ............ *F04D 29/388* (2013.01); *C23C 16/00* (2013.01); *F01D 11/122* (2013.01); *F02C 3/04* (2013.01); *F02K 3/06* (2013.01); *F04D 29/023* (2013.01); *F04D 29/164* (2013.01); *F04D 29/321* (2013.01); *F04D 29/325* (2013.01); *F05D 2220/36* (2013.01); *F05D 2230/90* (2013.01); *F05D 2300/2282* (2013.01); *F05D 2300/2291* (2013.01); *F05D 2300/43* (2013.01); *F05D 2300/509* (2013.01); *F05D 2300/516* (2013.01); *F05D 2300/6032* (2013.01); *Y02T 50/672* (2013.01)

(58) Field of Classification Search
CPC ... C23C 16/00; F02C 3/04; F02K 3/06; F04D 29/023; F04D 29/164; F04D 29/321; F04D 29/325; F04D 29/388; F05D 2220/36; F05D 2230/90; F05D 2300/43; F05D 2300/516; F05D 2300/6032; F05D 2300/2282

See application file for complete search history.

(56) References Cited

U.S. PATENT DOCUMENTS

| | | |
|---|---|---|
| 2,768,886 A | 10/1956 | Twombly |
| 3,350,178 A | 10/1967 | Miller |

(Continued)

FOREIGN PATENT DOCUMENTS

| | | |
|---|---|---|
| EP | 2907975 A1 | 8/2015 |
| WO | 2013075954 A1 | 5/2013 |
| WO | 2014151101 A1 | 9/2014 |

OTHER PUBLICATIONS

European Search Report dated Sep. 22, 2017 for European Patent Application No. 17168768.4.

(Continued)

*Primary Examiner* — Jesse S Bogue
(74) *Attorney, Agent, or Firm* — Bachman & LaPointe, P.C.

(57) ABSTRACT

An abrasive tip comprises an additive layer having an additive; the additive is configured to prevent adhesion of an organic component from an abradable seal onto an abrasive blade tip.

18 Claims, 2 Drawing Sheets

(51) Int. Cl.
*F04D 29/02* (2006.01)
*F04D 29/16* (2006.01)
*F04D 29/32* (2006.01)

(56) References Cited

U.S. PATENT DOCUMENTS

| | | | |
|---|---|---|---|
| 4,249,913 A | 2/1981 | Johnson et al. | |
| 4,610,698 A | 9/1986 | Eaton et al. | |
| 4,689,242 A | 8/1987 | Pike | |
| 4,744,725 A | 5/1988 | Matarese et al. | |
| 4,903,440 A | 2/1990 | Kirk et al. | |
| 5,123,814 A | 6/1992 | Burdick et al. | |
| 5,196,471 A * | 3/1993 | Rangaswamy | C23C 4/04 428/403 |
| 5,551,961 A | 9/1996 | Engen et al. | |
| 5,603,603 A * | 2/1997 | Benoit | F01D 11/12 277/415 |
| 5,674,122 A | 10/1997 | Krech | |
| 5,702,811 A | 12/1997 | Ho et al. | |
| 5,954,844 A * | 9/1999 | Law | B24D 3/004 51/295 |
| 6,334,617 B1 | 1/2002 | Putnam et al. | |
| 6,887,530 B2 * | 5/2005 | Fiala | B22F 3/115 277/415 |
| 7,169,198 B2 | 1/2007 | Moeltgen et al. | |
| 7,179,507 B2 | 2/2007 | Fiala et al. | |
| 7,998,604 B2 * | 8/2011 | Reynolds | C23C 4/06 428/469 |
| 8,936,432 B2 | 1/2015 | Strock | |
| 9,581,041 B2 | 2/2017 | Sinatra et al. | |
| 10,202,854 B2 | 2/2019 | Uskert et al. | |
| 2010/0247323 A1 | 9/2010 | Persky et al. | |
| 2013/0108421 A1 | 5/2013 | Sinatra et al. | |
| 2014/0093360 A1 | 4/2014 | Strock | |
| 2015/0233255 A1 * | 8/2015 | Strock | F01D 5/20 60/805 |
| 2015/0354081 A1 * | 12/2015 | Strock | C25D 11/16 416/1 |
| 2016/0017725 A1 * | 1/2016 | Bogue | C23C 4/134 416/241 R |
| 2016/0032737 A1 * | 2/2016 | Strock | F01D 5/288 415/1 |
| 2016/0177745 A1 | 6/2016 | Uskert et al. | |
| 2016/0305258 A1 | 10/2016 | Strock | |
| 2016/0341051 A1 * | 11/2016 | Hewitt | F01D 11/12 |
| 2017/0314566 A1 | 11/2017 | Strock | |
| 2017/0314567 A1 | 11/2017 | Hansen et al. | |
| 2017/0314571 A1 | 11/2017 | Strock | |

OTHER PUBLICATIONS

European Search Report dated Sep. 21, 2017 for European Patent Application No. 17168754.4.
European Search Report dated Sep. 22, 2017 for European Patent Application No. 17168758.5.
European Search Report dated Sep. 22, 2017 for European Patent Application No. 17168760.1.
U.S. Notice of Allowance dated Nov. 2, 2018 issued in related U.S. Appl. No. 15/142,208.
U.S. Office Action dated May 22, 2018 in related U.S. Appl. No. 15/142,208.
U.S. Office Action dated Jul. 3, 2018 in related U.S. Appl. No. 15/142,272.
U.S. Office Action dated Sep. 6, 2018 in related U.S. Appl. No. 15/142,312.
U.S. Final Office Action dated Feb. 28, 2109 for U.S. Appl. No. 15/142,312.
U.S. Office Action dated Dec. 4, 2018 for U.S. Appl. No. 15/142,272.

* cited by examiner

ABRASIVE BLADE TIPS WITH ADDITIVE LAYER RESISTANT TO CLOGGING

BACKGROUND

This disclosure relates to abrasive tips for rotatable blades. Abradable seals or coatings (rub coatings) can be used to protect moving parts from damage during rub interaction while providing a small clearance. Such seals are used in turbomachines to interface with abrasive tips of a rotating blade stage.

The abrasive tips include coatings to enhance performance and limit heat generation and heat transfer to the blade. The abrasive tips, upon rubbing the abradable seal, remove portions of the abradable seal. The portions of the abradable seal can transfer to the abrasive tips and adhere to the abrasive tips. Carbonized portions of the abradable seal that adhere to the abrasive tips can build up. The portions of the carbon based materials that builds up between the grit particles of the abrasive tip can cause frictional heating during rub events. The frictional heating can cause failure of the polyurethane erosion resistant coating on the gas path surfaces of the blade. Thus, the very problem that the abrasive blade tip is designed to prevent, instead occurs through a different functional failure. Pending U.S. non-provisional application no. US 2015/0233255 is incorporated herein by reference.

What is needed is a coating that prevents clogging of the abrasive tip due to build-up of carbonized rub debris.

SUMMARY

In accordance with the present disclosure, there is provided an abrasive blade tip comprising an additive coating, the additive coating configured to prevent adhesion of an organic component of an abradable seal onto the abrasive blade tip.

In another and alternative embodiment, the additive coating comprises an additive selected from the group consisting of solid lubricant, zinc stearate, calcium stearate, hexagonal boron nitride, magnesium stearate, lithium fluoride and molydisulfide.

In another and alternative embodiment, the abrasive blade tip comprises a metal matrix and hard particles dispersed through the metal matrix.

In another and alternative embodiment, the additive is configured to prevent clogging of the spaces between the hard particles that protrude from the abrasive blade tip.

In another and alternative embodiment, the additive is configured to incorporate into rub debris comprising constituents of an organic matrix composite of the abradable seal.

In another and alternative embodiment, the additive is configured to lubricate the organic component responsive to a rub event with the abrasive blade tip additive is dispersed throughout the additive coating.

In accordance with the present disclosure, there is provided a gas turbine engine comprising a compressor section; a combustor fluidly coupled to the compressor section; a turbine section fluidly coupled to the combustor; a fan rotatably coupled with the turbine section, the fan including a plurality of circumferentially-spaced rotary blades, each of the blades comprising an airfoil section extending between leading and trailing edges, first and second opposed sides each joining the leading and trailing edges and an inner end opposite a free tip end; the airfoil including a polymeric overcoat on at least one of the leading edge, trailing edge, first side and second side, and each airfoil section including an abrasive tip at the free tip end, the abrasive tip comprising an additive layer, the additive layer comprising an additive; and a seal circumscribing the plurality of circumferentially spaced rotatable blades, the seal comprising an organic matrix composite and an organic component, the additive configured to prevent adhesion of the organic component onto the abrasive tip, the seal configured contactable with, and abradable by, the abrasive tip.

In another and alternative embodiment, the respective compositions of the seal and the abrasive tip being complimentarily selected with respect to frictional heat generated and heat-induced delamination of the polymeric overcoat.

In another and alternative embodiment, the additive is selected from the group consisting of solid lubricant, zinc stearate, calcium stearate, hexagonal boron nitride, magnesium stearate, lithium fluoride and molydisulfide.

In another and alternative embodiment, the abrasive tip comprises a metal matrix and hard particles dispersed through the metal matrix; wherein the additive is configured to prevent clogging of the spaces between the hard particles that protrude from the abrasive blade tip.

In another and alternative embodiment, the additive is configured to lubricate the organic component responsive to a rub event with the abrasive blade tip.

In another and alternative embodiment, the additive is configured to incorporate into rub debris comprising constituents of the organic matrix composite.

In accordance with the present disclosure, there is provided a fan rotor system comprising a plurality of circumferentially-spaced rotary blades, each of the blades comprising an airfoil section extending between leading and trailing edges, first and second opposed sides each joining the leading and trailing edges and an inner end opposite a free tip end; the airfoil including a polymeric overcoat on at least one of the leading edge, trailing edge, first side and second side, and each airfoil section including an abrasive tip at the free tip end, the abrasive tip including an additive layer comprising an additive, and a seal circumscribing the plurality of circumferentially spaced rotatable blades, the seal comprising an organic matrix composite comprising an organic component, the additive configured to prevent adhesion of the organic component onto the abrasive tip, the seal configured contactable with, and abradable by, the abrasive tip.

In another and alternative embodiment, the additive is selected from the group consisting of solid lubricant, zinc stearate, calcium stearate, hexagonal boron nitride, magnesium stearate, lithium fluoride and molydisulfide.

In another and alternative embodiment, the abrasive tip comprises a metal matrix and hard particles dispersed through the metal matrix; wherein the additive is configured to prevent clogging of the spaces between the hard particles that protrude from the abrasive blade tip.

In another and alternative embodiment, the additive is configured to lubricate the organic component responsive to a rub event with the abrasive blade tip.

In another and alternative embodiment, the additive is configured to incorporate into rub debris comprising constituents of the organic matrix composite.

In accordance with the present disclosure there is presented a process of applying an additive coating to a blade tip comprising providing a blade having an airfoil section extending between leading and trailing edges, first and second opposed sides each joining the leading and trailing edges and an inner end opposite a free tip end. The process includes coating the free tip end with a metal matrix having hard particles. The process includes dispersing the hard particles throughout the metal matrix. The process includes preconditioning the metal matrix wherein the hard particles are exposed above the metal matrix. The process includes coating the metal matrix with an additive layer, the additive layer comprising an additive comprising an additive selected from the group consisting of solid lubricant, zinc stearate, calcium stearate, hexagonal boron nitride, magnesium stearate, lithium fluoride and molydisulfide; and covering or filling spaces between the hard particles with the additive layer.

In another and alternative embodiment the process includes preconditioning further comprises wearing down the metal matrix and exposing the hard particles and providing relief before the additive layer is added.

Other details of the coating are set forth in the following detailed description and the accompanying drawing wherein like reference numerals depict like elements.

DETAILED DESCRIPTION

Figure 1:
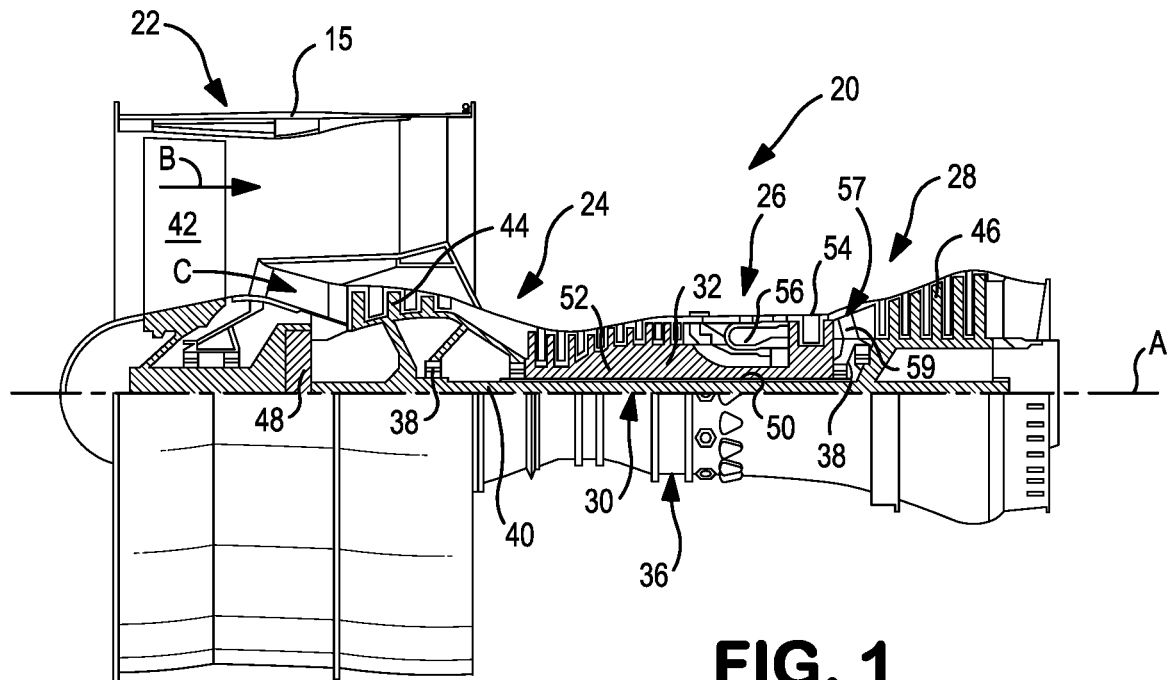
FIG. 1 illustrates an example gas turbine engine.

FIG. 1 schematically illustrates a gas turbine engine 20. The gas turbine engine 20 is disclosed herein as a two-spool turbofan that generally incorporates a fan section 22, a compressor section 24, a combustor section 26 and a turbine section 28. Alternative engines might include an augmenter section (not shown) among other systems or features. The fan section 22 drives air along a bypass flow path B in a bypass duct defined within a fan case 15, and into a core flow path C to the compressor section 24 for compression and communication into the combustor section 26 then expansion through the turbine section 28. Although depicted as a two-spool turbofan gas turbine engine in the disclosed non-limiting embodiment, it should be understood that the concepts described herein are not limited to use with two-spool turbofans as the teachings may be applied to other types of turbine engines including three-spool architectures.

The exemplary engine 20 generally includes a low speed spool 30 and a high speed spool 32 mounted for rotation about an engine central longitudinal axis A relative to an engine static structure 36 via several bearing systems 38. It should be understood that various bearing systems 38 at various locations may alternatively or additionally be provided and the location of bearing systems 38 may be varied as appropriate to the application.

The low speed spool 30 generally includes an inner shaft 40 that interconnects a fan 42, a first (or low) pressure compressor 44 and a first (or low) pressure turbine 46. The inner shaft 40 is connected to the fan 42 through a speed change mechanism, which in exemplary gas turbine engine 20 is illustrated as a geared architecture 48 to drive the fan 42 at a lower speed than the low speed spool 30. The high speed spool 32 includes an outer shaft 50 that interconnects a second (or high) pressure compressor 52 and a second (or high) pressure turbine 54. A combustor 56 is arranged in exemplary gas turbine 20 between the high pressure compressor 52 and the high pressure turbine 54. A mid-turbine frame 57 of the engine static structure 36 is arranged generally between the high pressure turbine 54 and the low pressure turbine 46. The mid-turbine frame 57 further supports bearing systems 38 in the turbine section 28. The inner shaft 40 and the outer shaft 50 are concentric and rotate via bearing systems 38 about the engine central longitudinal axis A which is collinear with their longitudinal axes.

The core airflow is compressed by the low pressure compressor 44 then the high pressure compressor 52, mixed and burned with fuel in the combustor 56, then expanded over the high pressure turbine 54 and low pressure turbine 46. The mid-turbine frame 57 includes airfoils 59 which are in the core airflow path C. The turbines 46, 54 rotationally drive the respective low speed spool 30 and high speed spool 32 in response to the expansion. It will be appreciated that each of the positions of the fan section 22, compressor section 24, combustor section 26, turbine section 28, and fan drive gear system 48 may be varied. For example, gear system 48 may be located aft of combustor section 26 or even aft of turbine section 28, and fan section 22 may be positioned forward or aft of the location of gear system 48.

The engine 20 in one example is a high-bypass geared aircraft engine. In a further example, the engine 20 bypass ratio is greater than about six (6), with an example embodiment being greater than about ten (10), the geared architecture 48 is an epicyclic gear train, such as a planetary gear system or other gear system, with a gear reduction ratio of greater than about 2.3 and the low pressure turbine 46 has a pressure ratio that is greater than about five. In one disclosed embodiment, the engine 20 bypass ratio is greater than about ten (10:1), the fan diameter is significantly larger than that of the low pressure compressor 44, and the low pressure turbine 46 has a pressure ratio that is greater than about five (5:1). Low pressure turbine 46 pressure ratio is pressure measured prior to inlet of low pressure turbine 46 as related to the pressure at the outlet of the low pressure turbine 46 prior to an exhaust nozzle. The geared architecture 48 may be an epicycle gear train, such as a planetary gear system or other gear system, with a gear reduction ratio of greater than about 2.3:1. It should be understood, however, that the above parameters are only exemplary of one embodiment of a geared architecture engine and that the present invention is applicable to other gas turbine engines including direct drive turbofans.

A significant amount of thrust is provided by the bypass flow B due to the high bypass ratio. The fan section 22 of the engine 20 is designed for a particular flight condition—typically cruise at about 0.8 Mach and about 35,000 feet. The flight condition of 0.8 Mach and 35,000 ft, with the engine at its best fuel consumption—also known as "bucket cruise Thrust Specific Fuel Consumption" (TSFC)—is the industry standard parameter of lbm of fuel being burned divided by lbf of thrust the engine produces at that operating point. "Low fan pressure ratio" is the pressure ratio across the fan blade alone, without a Fan Exit Guide Vane ("FEGV") system. The low fan pressure ratio as disclosed herein according to one non-limiting embodiment is less than about 1.45. "Low corrected fan tip speed" is the actual fan tip speed in ft/sec divided by an industry standard temperature correction of $[(Tram\ °\ R)/(518.7°\ R)]^{0.5}$. The "Low corrected fan tip speed" as disclosed herein according to one non-limiting embodiment is less than about 1150 ft/second.

Figure 2:
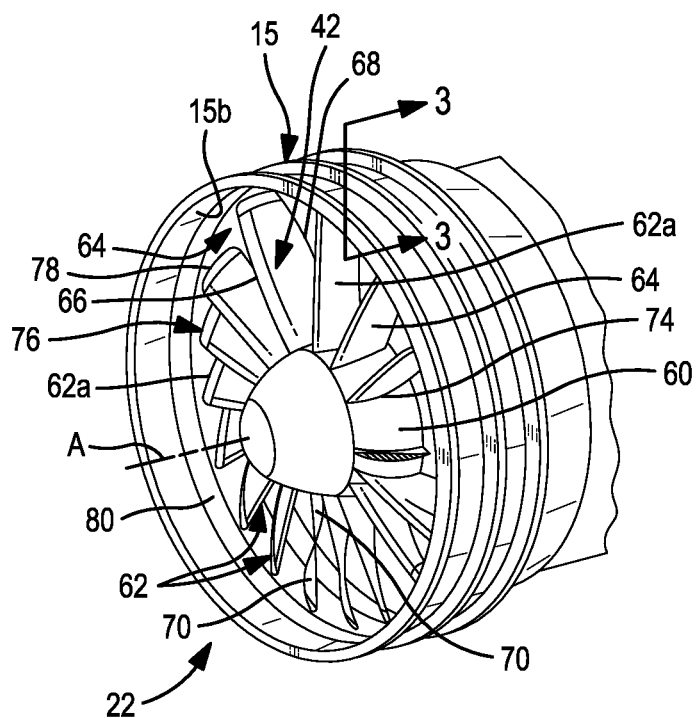
FIG. 2 illustrates an isolated view of the fan section of the gas turbine engine of FIG. 1.

FIG. 2 illustrates an isolated view of the fan section 22 of the engine 20. The fan 42 includes a rotor 60 that has a plurality of circumferentially-spaced blades 62. Each blade 62 includes an airfoil section 64 that extends between leading and trailing edges 66/68, first and second opposed sides 70/72 that each joins the leading and trailing edges 66/68, and an inner end 74 and a free tip end 76. Each blade includes an abrasive tip 78 at the free tip end 76.

The fan case 15 is annular in shape and circumscribes the blades 62. The fan section 22 is designed such that the abrasive tips 78 of the blades 62 rub against the fan case 15 during rotation. In this regard, the fan case 15 includes an abradable seal 80 mounted on a radially inner side of the fan case 15.

When two components are in rubbing contact, at least one of the components may wear. The term "abradable" refers to the one of the two components that wears, while the other component is "abrasive" and does not wear or wears less. Thus, when the abrasive tips 78 of the blades 62 rub against the seal 80, the seal 80 will be worn whereas the abrasive tips 78 will not wear or will wear less than the seal 80. The word "abrasive" thus also implies that there is or can be contact with an abradable component.

Figure 3:
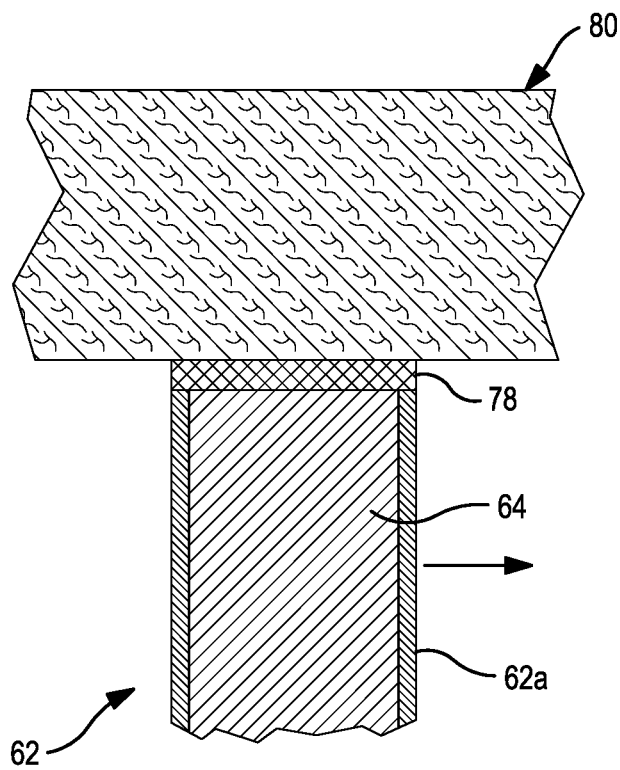
FIG. 3 illustrates an abrasive tip interfacing with an abradable seal.

FIG. 3 shows a cutaway view of a representative portion of the airfoil section 64 of one of the blades 62 and a portion of the abradable seal 80. The airfoil section 64 is formed of a metal-based material with a polymeric overcoat 62a on the surfaces thereof. For example, the polymeric overcoat 62a serves to protect the underlying airfoil section 64 from erosion due to foreign particulate ingested into the engine 20. In one example, the metal-based material of the airfoil section 64 is an aluminum alloy.

The polymeric coating 62a can be a polyurethane-based coating, an epoxy-based coating, or a silicone rubber-based coating, but is not limited to these types of polymeric coatings or materials. The polymeric coating 62a can cover the first and second sides 70/72 of the blades 62 and can span the entire lateral surface of the blade 62 between the leading and trailing edges 66/68.

Friction between a blade tip and a surrounding case generates heat. The heat can be conducted into the case, into the blade, or both. However, in particular for metal blades and polymeric-based cases, the metal of the blade is generally a better thermal conductor than the polymer of the case, and a majority of the heat thus can conduct into the blade. While this may normally not present any detriments for a plain metal blade, the heat conduction can be detrimental to a metal blade that has a polymeric overcoat because the heat can cause delamination of the polymeric overcoat and thus compromise the erosion protection. In this regard, the abrasive tip 78 has a composition selected with respect to heat-induced delamination of the polymeric overcoat 62a from frictional heat generated during rubbing between the abrasive tip 78 and the abradable seal 80. That is, the respective compositions of the abradable seal 80 and the abrasive tip 78 are complimentarily selected with respect to frictional heat generated and heat-induced delamination of the polymeric overcoat 62a. For example, the compositions are selected with regard to a blade temperature at which the polymeric overcoat 62a does not delaminate nor has defined delamination durability over an extended period of time, such as the life of the engine 20.

The abradable seal 80 is formed of a polymeric-based material, such as a polymer matrix composite. In one further example, the polymer matrix composite includes an epoxy matrix and a silica-containing filler dispersed through the matrix. In a further example, the silica-containing filler is or includes hollow glass microspheres. An example is 3M™ Scotch-Weld™ Structural Void Filling Compound EC-3555.

Figure 4:
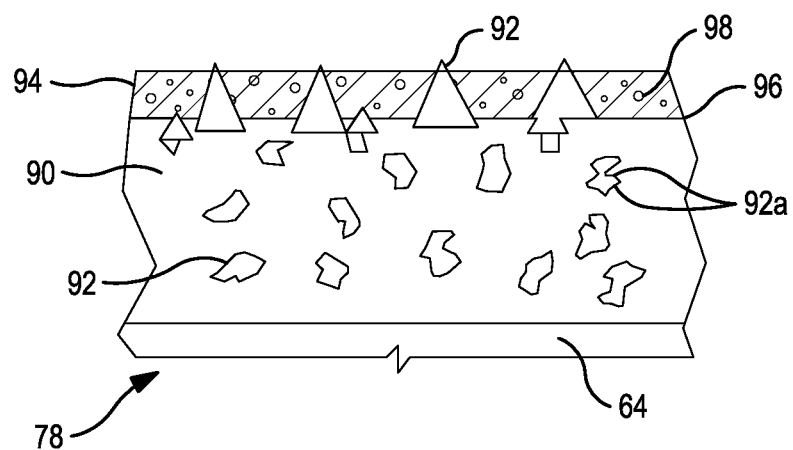
FIG. 4 illustrates a cross-section of an abrasive tip.

FIG. 4 illustrates a cross-section of representative portion of a further example of the abrasive tip 78. In this example, the abrasive tip 78 includes a metal matrix 90 and hard particles 92 dispersed through the metal matrix 90. In one further example, the metal matrix 90 and the metal-based material of the airfoil section 64 are compositionally composed of the same predominant metal, which can promote strong adhesion if the abrasive tip 78 interfaces with the metal-based material (i.e., the abrasive tip 78 is in direct contact with the metal-based material, as depicted in FIG. 4). As an example, the metal can be aluminum.

In one further example, the metal matrix 90 is a eutectic aluminum-silicon alloy having a composition, by atomic weight, of 88% aluminum and 12% silicon. The eutectic composition provides high hardness and strength to enhance holding the hard particles 92 in the metal matrix 90. The eutectic composition also has good high temperature properties and retains strength at high temperatures rather than softening.

In one further example, the metal matrix 90 is, or predominantly includes, aluminum, and the hard particles 92 are, or predominantly include, alumina ($Al_2O_3$). In an additional example, the hard particles 92 are, or predominantly include, zirconia ($ZrO_2$). In yet another example, the hard particles 92 are, or predominantly include, alumina and zirconia. It is to be understood that the hard particles 92 are not limited to alumina and zirconia, and other oxides, nitrides, carbides, oxycarbides, oxynitrides, diamond and combinations thereof can be used selectively, with respect to heat-induced delamination of the polymeric overcoat 62a from frictional heat generated during rubbing between the abrasive tip 78 and the abradable seal 80.

The abrasive tip 78 can have a thickness in a thickness range of 0.025-1.3 millimeters, and the hard particles 92 can have an average maximum dimension in a particle size range of 10-200 micrometers. The hard particles 92 may protrude from the metal matrix 90 or be completely covered by the metal matrix.

In one further example a polymer matrix filled with hollow glass microspheres for the abradable seal 80 is complimentary with a metal matrix 90 of aluminum and hard particles 92 of alumina, zirconia, or both in the abrasive tip 78, with respect to frictional heat generated and heat-induced delamination of the polymeric overcoat 62a. That is, the frictional heat generated between the abradable seal 80 and the abrasive tip 78 cause a blade 62 temperature at which the example polymer of the polymeric overcoat 62a does not delaminate, or at least meets delamination durability over an extended period of time, such as the life of the engine 20.

In the illustrated example in FIG. 4, the hard particles 92 are faceted and thus have angled facets 92a. The angled facets 92a provide relatively sharp corners that facilitate efficient "cutting" through the abradable seal 80 with low cutting forces, which lowers frictions and, in turn, contributes to lowering the amount of heat generated. In one example, the hard particles 92 are DURALUM ATZ II that has approximately 40% tetragonal zirconia with titania evenly distributed throughout the individual alumina grains.

An additive layer 94 can be coupled to the surface 96 of the abrasive blade tip 78 opposite the airfoil section 64. Incorporated into the additive layer 94 is a release agent or solid lubricant or simply additive 98. The additive 98 can comprise a metal stearate. In exemplary embodiments, the additive can comprise stearates or palmitates of zinc, aluminum, barium, calcium, strontium and the like. The additive 98 can comprise solid lubricants such as hexagonal boron nitride, lithium fluoride and molydisulfide. The additive 98 can be a suspension or solution of the calcium stearate or other metal stearate, or solid lubricant with a solid binder component. The additive 98 is compatible with plastic materials and other solid binders.

In an exemplary embodiment, the additive layer 94 can be created by spraying the surface 96 of the abrasive blade tip 78 with a 25 wt % dispersion of calcium stearate in epoxy resin, thinned to a sprayable consistency with lacquer thinner or other compatible solvent. The additive layer 94 can also be painted on the blade tip 78. The layer 94 can be dried and cured to form a film. The additive layer 94 can comprise a thickness of from about 0.1 to about 50 micro grams per square inch in mass per area.

In order to promote the effectiveness of the hard particles 92, the surface 96 can be conditioned to prepare the hard particles 92 for exposure. The metal matrix 90 can be worn down to expose the hard particles 92 and provide relief before the additive layer 94 is added. In an exemplary embodiment, the pre-conditioning can be performed by running the blade 62 tip 78 against a cloth belt or disk with an abrasive slurry, such as 600 mesh aluminum oxide or silica in the general direction of the blade 62 motion in the engine. Conditioning the surfaces and metal matrix 90 helps to prevent removal of the additive layer 94 during early stages of rubbing while the abrasive tip 78 experiences high wear rate until a sufficient number of grit particles 92 are exposed by the aluminum metal matrix 90 wear.

The additive 98 becomes incorporated into the rub debris upon a rub event. The additive 98 within the rub debris prevents the organic compounds of the abradable seal 80 from adhering to the abrasive blade tip 78. Since the components of the abradable seal 80 are prevented from adhering to the abrasive tip 78, then clogging of the abrasive tip 78 between the cutting surfaces can be prevented.

The additive 98 helps to prevent clogging of the spaces between the hard particles 92 that protrude, as the hard particles are exposed to the upper surface of the metal matrix 90. The additive layer 94 conforms to the surface with the hard particles 92 protruding beyond the additive layer 94.

The benefit of the additive 98 on the abrasive tip 78 is to prevent thermal damage to the polyurethane erosion resistant coating 62a on the blades. This is accomplished by preserving the cutting ability of the abrasive tip 78. By incorporating the additive onto the abrasive tip 78, the entire operation of applying surface treatments to the blade tip abrasive can be eliminated and present a cost effective alternative.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

There has been provided an abrasive tip coating resistant to clogging of abrasive blade tips. While the coating has been described in the context of specific embodiments thereof, other unforeseen alternatives, modifications, and variations may become apparent to those skilled in the art having read the foregoing description. Accordingly, it is intended to embrace those alternatives, modifications, and variations which fall within the broad scope of the appended claims.

What is claimed is:

1. An abrasive blade tip comprising:
   an additive coating, wherein said additive coating comprises an additive consisting of magnesium stearate, said additive coating configured to prevent adhesion of an organic component of an abradable seal onto the abrasive blade tip.

2. The abrasive blade tip according to claim 1, wherein said abrasive blade tip comprises a metal matrix and hard particles dispersed through said metal matrix.

3. The abrasive blade tip according to claim 2, wherein said additive is configured to prevent clogging of the spaces between the hard particles that protrude from the abrasive blade tip.

4. The abrasive blade tip according to claim 1, wherein said additive is configured to incorporate into rub debris comprising constituents of an organic matrix composite of said abradable seal.

5. The abrasive blade tip according to claim 1, wherein said additive is configured to lubricate said organic component responsive to a rub event with said abrasive blade tip.

6. The abrasive blade tip according to claim 1, wherein said additive is dispersed throughout said additive coating.

7. A gas turbine engine comprising:
   a compressor section;
   a combustor fluidly coupled to said compressor section;
   a turbine section fluidly coupled to said combustor;
   a fan rotatably coupled with said turbine section, said fan including a plurality of circumferentially-spaced rotary blades, each of said blades comprising an airfoil section extending between leading and trailing edges, first and second opposed sides each joining the leading and trailing edges and an inner end opposite a free tip end; said airfoil including a polymeric overcoat on at least one of the leading edge, trailing edge, first side and second side, and each airfoil section including an abrasive tip at said free tip end, said abrasive tip comprising an additive layer, said additive layer comprising an additive, wherein said additive is magnesium stearate; and
   a seal circumscribing the plurality of circumferentially spaced rotatable blades, said seal comprising an organic matrix composite and an organic component, said additive configured to prevent adhesion of said organic component onto said abrasive tip, said seal configured contactable with, and abradable by, said abrasive tip.

8. The turbine engine component according to claim 7, wherein the respective compositions of said seal and said abrasive tip being complimentarily selected with respect to frictional heat generated and heat-induced delamination of said polymeric overcoat.

9. The turbine engine component according to claim 7, wherein said abrasive tip comprises a metal matrix and hard particles dispersed through said metal matrix; wherein said additive is configured to prevent clogging of the spaces between the hard particles that protrude from the abrasive blade tip.

10. The turbine engine system according to claim 7, wherein said additive is configured to lubricate said organic component responsive to a rub event with said abrasive blade tip.

11. The turbine engine system according to claim 7, wherein said additive is configured to incorporate into rub debris comprising constituents of said organic matrix composite.

12. A fan rotor system comprising:
    a plurality of circumferentially-spaced rotary blades, each of said blades comprising an airfoil section extending between leading and trailing edges, first and second opposed sides each joining the leading and trailing edges and an inner end opposite a free tip end; said airfoil including a polymeric overcoat on at least one of the leading edge, trailing edge, first side and second side, and each airfoil section including an abrasive tip at said free tip end, said abrasive tip including an additive layer comprising an additive wherein said additive is magnesium stearate, and a seal circumscribing the plurality of circumferentially spaced rotatable blades, said seal comprising an organic matrix composite comprising an organic component, said additive configured to prevent adhesion of said organic component onto said abrasive tip, said seal configured contactable with, and abradable by, said abrasive tip.

13. The fan rotor system claim 12, wherein said abrasive tip comprises a metal matrix and hard particles dispersed through said metal matrix; wherein said additive is configured to prevent clogging of the spaces between the hard particles that protrude from the abrasive blade tip.

14. The fan rotor system claim 12, wherein said additive is configured to lubricate said organic component responsive to a rub event with said abrasive blade tip.

15. The fan rotor system claim 12, wherein said additive is configured to incorporate into rub debris comprising constituents of said organic matrix composite.

16. A process of applying an additive coating to a blade tip comprising:

providing a blade having an airfoil section extending between leading and trailing edges, first and second opposed sides each joining the leading and trailing edges and an inner end opposite a free tip end;

coating said free tip end with a metal matrix having hard particles;

dispersing said hard particles throughout said metal matrix;

preconditioning said metal matrix wherein said hard particles are exposed above said metal matrix; coating said metal matrix with an additive layer, said additive layer comprising an additive comprising an additive consisting of magnesium stearate; and covering spaces between said hard particles with said additive layer.

17. The process of claim 16, wherein said preconditioning further comprises:

wearing down the metal matrix; and exposing the hard particles and providing relief before the additive layer is added.

18. The process of claim 16, wherein said covering spaces further comprises:

filling spaces between said hard particles with said additive layer.

* * * * *